(12) United States Patent
Gammel

(10) Patent No.: US 7,106,091 B2
(45) Date of Patent: Sep. 12, 2006

(54) CIRCUIT CONFIGURATION AND METHOD FOR DETECTING AN UNWANTED ATTACK ON AN INTEGRATED CIRCUIT

(75) Inventor: Berndt Gammel, München (DE)

(73) Assignee: Infineon Technologies AG, Munich (DE)

(*) Notice: Subject to any disclaimer, the term of this patent is extended or adjusted under 35 U.S.C. 154(b) by 561 days.

(21) Appl. No.: 10/386,332

(22) Filed: Mar. 11, 2003

(65) Prior Publication Data

US 2003/0218475 A1 Nov. 27, 2003

Related U.S. Application Data

(63) Continuation of application No. PCT/DE01/03335, filed on Aug. 30, 2001.

(30) Foreign Application Priority Data

Sep. 11, 2000 (DE) .............................. 100 44 837

(51) Int. Cl.
| | |
|---|---|
| *H03K 19/00* | (2006.01) |
| *H03K 19/173* | (2006.01) |
| *G06F 7/38* | (2006.01) |
| *G06F 11/30* | (2006.01) |
| *G06F 12/14* | (2006.01) |

(52) U.S. Cl. .............................. 326/8; 326/37; 326/38; 326/94; 713/190; 713/193; 713/194

(58) Field of Classification Search ................... 326/8, 326/37–38, 94; 365/189.07; 713/193–194, 713/601, 190
See application file for complete search history.

(56) References Cited

U.S. PATENT DOCUMENTS 4,933,898 A 6/1990 Gilberg et al.

| 5,377,264 A | * | 12/1994 | Lee et al. .................... 713/189 |
| 5,825,878 A | * | 10/1998 | Takahashi et al. .......... 713/190 |
| 6,337,821 B1 | * | 1/2002 | Watanabe et al. ........... 365/202 |

FOREIGN PATENT DOCUMENTS

| EP | 0 417 447 A2 | 3/1991 |
| EP | 0 860 882 A2 | 8/1998 |
| RU | 2 106 686 C1 | 3/1998 |
| WO | WO 99/04334 | 1/1999 |
| WO | 00/28399 | 5/2000 |

* cited by examiner

OTHER PUBLICATIONS

Alain J. Martin et al.: "The Design of an Asynchronous MIPS R3000 Mircroprocessor", *Proceedings of the 17th Conference on Advanced research in VLSI*, Ann Arbor, MI, Sep. 15-16, 1997, pp. 164-181.

*Primary Examiner*—Rexford Barnie
*Assistant Examiner*—Jason Crawford
(74) *Attorney, Agent, or Firm*—Laurence A. Greenberg; Werner H. Stemer; Ralph E. Locher

(57) ABSTRACT

A circuit configuration for detecting an unwanted attack on an integrated circuit has a signal line to which a clock signal is applied and at least one line pair which is respectively used to code a bit. The signal line and the at least one line pair are connected between a first and a second circuit block in the integrated circuit. The signal line and the at least one line pair are connected to a detector circuit which changes the operating sequence in the integrated circuit on the basis of the signals on the signal line and on the at least one line pair. The detector circuit can be used to the same extent to test for production faults.

8 Claims, 4 Drawing Sheets

| State No. | Clock | L1.k | L2.k | Logic value | |
|---|---|---|---|---|---|
| 1 | 0 | 1 | 1 | O.K. | |
| 2 | 0 | 1 | 0 | Prohibited state | |
| 3 | 0 | 0 | 1 | Prohibited state | |
| 4 | 0 | 0 | 0 | Prohibited state | |
| 5 | 1 | 1 | 1 | Prohibited state | |
| 6 | 1 | 1 | 0 | 0 | 1 |
| 7 | 1 | 0 | 1 | 1 | 0 |
| 8 | 1 | 0 | 0 | Prohibited state | |

| State No. | Clock | L1.k | L2.k | Logic value | |
|---|---|---|---|---|---|
| 1 | 0 | 1 | 1 | Prohibited state | |
| 2 | 0 | 1 | 0 | Prohibited state | |
| 3 | 0 | 0 | 1 | Prohibited state | |
| 4 | 0 | 0 | 0 | O.K. | |
| 5 | 1 | 1 | 1 | Prohibited state | |
| 6 | 1 | 1 | 0 | 0 | 1 |
| 7 | 1 | 0 | 1 | 1 | 0 |
| 8 | 1 | 0 | 0 | Prohibited state | |

| State No. | Clock | L1.k | L2.k | Logic value |    |
|---|---|---|---|---|---|
| 1 | 1 | 1 | 1 | O.K. | |
| 2 | 1 | 1 | 0 | Prohibited state | |
| 3 | 1 | 0 | 1 | Prohibited state | |
| 4 | 1 | 0 | 0 | Prohibited state | |
| 5 | 0 | 1 | 1 | Prohibited state | |
| 6 | 0 | 1 | 0 | 0 | 1 |
| 7 | 0 | 0 | 1 | 1 | 0 |
| 8 | 0 | 0 | 0 | Prohibited state | |

| State No. | Clock | L1.k | L2.k | Logic value |    |
|---|---|---|---|---|---|
| 1 | 1 | 1 | 1 | Prohibited state | |
| 2 | 1 | 1 | 0 | Prohibited state | |
| 3 | 1 | 0 | 1 | Prohibited state | |
| 4 | 1 | 0 | 0 | O.K. | |
| 5 | 0 | 1 | 1 | Prohibited state | |
| 6 | 0 | 1 | 0 | 0 | 1 |
| 7 | 0 | 0 | 1 | 1 | 0 |
| 8 | 0 | 0 | 0 | Prohibited state | |

CIRCUIT CONFIGURATION AND METHOD FOR DETECTING AN UNWANTED ATTACK ON AN INTEGRATED CIRCUIT

CROSS-REFERENCE TO RELATED APPLICATION

This application is a continuation of copending International Application No. PCT/DE01/03335, filed Aug. 30, 2001, which designated the United States and was not published in English.

BACKGROUND OF THE INVENTION

Field of the Invention

The present invention relates to a circuit configuration for detecting an unwanted attack on an integrated circuit. The circuit configuration has a signal line to which a clock signal is applied and also has at least one line pair which is respectively used to code a bit. The signal line and the at least one line pair are connected between a first and a second circuit block in the integrated circuit.

Many circuits used, by way of example, in microprocessors, security token or other data processing units require that data be processed on a high security level in a manner that is secure against physical attacks and against tapping. Such an attack is possible by analyzing the integrated circuit using "reverse engineering". The analysis can be used both to analyze the way in which the integrated circuit works and to influence the way in which it works in order to manipulate the data content or the operating sequence.

In practice, there are already various methods that can be used to make such analysis more difficult, at least.

By way of example, it is known practice to cover the integrated circuit using a "shield". In this context, a shield contains at least two interconnects running—generally meandrously—over the integrated circuit. Any interruption or shorting of these interconnects is detected by an evaluation circuit which then puts the integrated circuit into a secure state. This could involve the triggering of a reset or the erasure of memory contents, for example. Methods are also known which can be used to detect the distance of a plastic housing made of molded plastic. This involves detection of a change in capacitance between two interconnects when the molded plastic is removed. For this purpose, a plurality of sensors are provided in the molded plastic housing.

There are also methods that detect the distance of the passivation layer over the chip surface.

To defend against crypto-analytical attacks, integrated circuits in security-related fields of use are often implemented using the circuit technology known as "dual rail with precharge". In this case, a bit is coded using two complementary lines. In a first clock phase, the "precharge phase", the two complementary lines are precharged (Logic 1 or High), which erases previously stored information. In the second clock phase, the "evaluation phase", one of the two lines is discharged (Logic 0 or Low) and is evaluated on the next clock edge.

All the detection methods cited above are used to prevent access to the interconnects in the integrated circuit. As soon as these obstacles have been overcome, the data transmitted via the integrated circuit interconnects can be analyzed or manipulated. Manipulation can be effected by impressing a voltage or by severing lines, for example.

SUMMARY OF THE INVENTION

It is accordingly an object of the invention to provide a circuit configuration and a method for detecting an unwanted attack on an integrated circuit that overcome the above-mentioned disadvantages of the prior art devices and of this general type, which permit improved protection.

With the foregoing and other objects in view there is provided, in accordance with the invention, a circuit configuration for detecting an unwanted attack on an integrated circuit having a first circuit block and a second circuit block. The circuit configuration contains a signal line for receiving a clock signal connected between the first and second circuit blocks, at least one line pair used to code a bit and connected between the first and second circuit blocks, and a detector circuit connected to the signal line and to the line pair. The detector circuit changes an operating sequence in the integrated circuit on a basis of signals on the signal line and on the line pair.

In this case, the integrated circuit uses the aforementioned "dual rail with precharge" technology, that is to say a bit is coded using a line pair. In this context, the integrated circuit can have a multiplicity of line pairs. The invention provides for a signal line to which a clock signal is applied and the at least one line pair to be connected to a detector circuit which changes the operating sequence in the integrated circuit on the basis of the signals on the signal line and on the at least one line pair.

In one variant, each line in the at least one line pair is connected directly to the detector circuit. Alternatively, the line pairs can be connected to the detector circuit by a multiplexer. The signal line to which a clock signal is applied is connected to the detector circuit in each of the two variants.

In this case, the inventive circuit configuration makes use of the circumstance that the valid states, in the case of the "dual rail with precharge" technology the valid logic states, are confronted by five prohibited states. These are ascertained by the detector circuit, which can change the operating sequence in the integrated circuit if needed.

Besides the detection of prohibited states during operation of the protected circuit, which indicate a physical attack (for example using needles, "focused ion beam", manipulation of light, temperature or voltage), the inventive circuit configuration can be activated during the actual production test, that is to say the self test of the circuit. This allows detection of production faults, for example stuck-atone or stuck-at-zero faults. Since it can be assumed that there are no attacks when the integrated circuit is produced, invalid values on the line pairs indicate a malfunction, for example a short circuit.

The inventive circuit configuration is advantageously of extremely simple construction since it additionally requires only one detector circuit connected to the line pairs and the signal line to which a clock signal is applied.

The way in which the inventive circuit configuration works will become clear from the method described below.

A first signal value on the signal line involves the two lines in a line pair being monitored for an identical signal level. A second signal value on the signal line involves the two lines in a line pair being monitored for a different signal level, with any discrepancy from the expected results involving the operating sequence in the integrated circuit being changed.

In other words, one of the five prohibited states explained in more detail below prompts an operating sequence for the integrated circuit. In this case, the inventive method makes use of monitoring of the charge states (signal level) on the two lines in a line pair, with the check on the prohibited states being able to be shown using a state or validity table. The implementation of the validity table in terms of circuitry is a standard task and is therefore not explained in more detail at this point.

The precharge phase can, in principle, be stipulated for a first signal value of either Logic 0 or Logic 1.

Advantageously, the first signal value on the signal line is Logic 0. In this case, the state table shows the normal procedure for "dual rail with precharge" technology.

While the first signal value is applied to the signal line, in one refinement the signal level on the two lines in a line pair is respectively Logic 0 or respectively Logic 1. One of these two states thus stipulates a valid "precharge". The respective three other remaining states thus define the prohibited states.

Accordingly, the second signal value on the signal line is Logic 1 or Logic 0. The second signal value is thus fundamentally the complement of the first signal value on the signal line.

While the second signal value on the signal line is applied, the signal value on the first line in a line pair is Logic 0 or 1, while the signal value on the second line is Logic 1 or 0, that is to say is complementary.

A prohibited state therefore exists when there is an identical value on both lines in a line pair while the second signal value is on the signal line. In total, five prohibited states are thus obtained.

Other features which are considered as characteristic for the invention are set forth in the appended claims.

Although the invention is illustrated and described herein as embodied in a circuit configuration and a method for detecting an unwanted attack on an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4 to 7 are four state tables.

DESCRIPTION OF THE PREFERRED EMBODIMENTS

Figure 1:
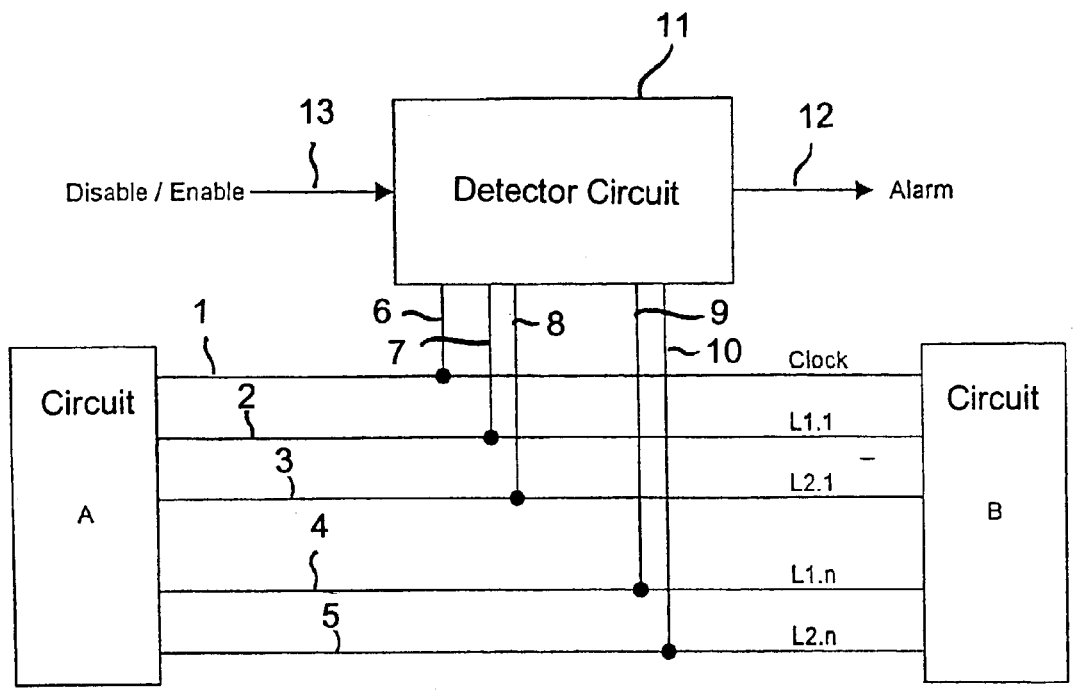
FIG. 1 is a block diagram of a first exemplary embodiment of a circuit configuration according to the invention.

Referring now to the figures of the drawing in detail and first, particularly, to FIG. 1 thereof, there is shown a first exemplary embodiment of the inventive circuit configuration for detecting an unwanted attack on an integrated circuit. In FIG. 1, the integrated circuit is illustrated, by way of example, by circuit blocks A, B, between which there are interconnects 1 to 5. In the configuration, the interconnect 1 is a signal line "clock", to which a clock signal is applied. In addition, two line pairs L1.1, L2.1 and L1.n, L2.n are shown by way of example. In the present example, two bits can thus be transmitted between the circuit blocks A, B. In principle, it is naturally possible for any number of line pairs to be connected between the circuit blocks A and B.

The invention provides a detector circuit 11 for the purpose of monitoring the interconnects functioning as signal lines 1–5. Each of the signal lines 1 to 5 connected between the circuit blocks A, B is connected to the detector circuit 11. This is illustrated by interconnects 6 to 10. If a state is prohibited, the detector circuit 11 can trigger an alarm using a line 12, which allows the integrated circuit to be restarted or allows security-related data to be erased, for example.

It is also conceivable for the detector circuit 11 to be selectively activated or deactivated using a signal line 13.

In the first exemplary embodiment, as shown in FIG. 1, each of the signal lines 1 to 5 is connected directly to the detector circuit 11. In the exemplary embodiment shown in FIG. 2, just the signal line 1, to which the clock signal is applied, is connected directly to the detector circuit 11 by the signal line 6. By contrast, the line pairs L1.1, L2.1 and L1.n, L2.n are connected to the detector circuit 11 by a multiplexer 14.

Figure 2:
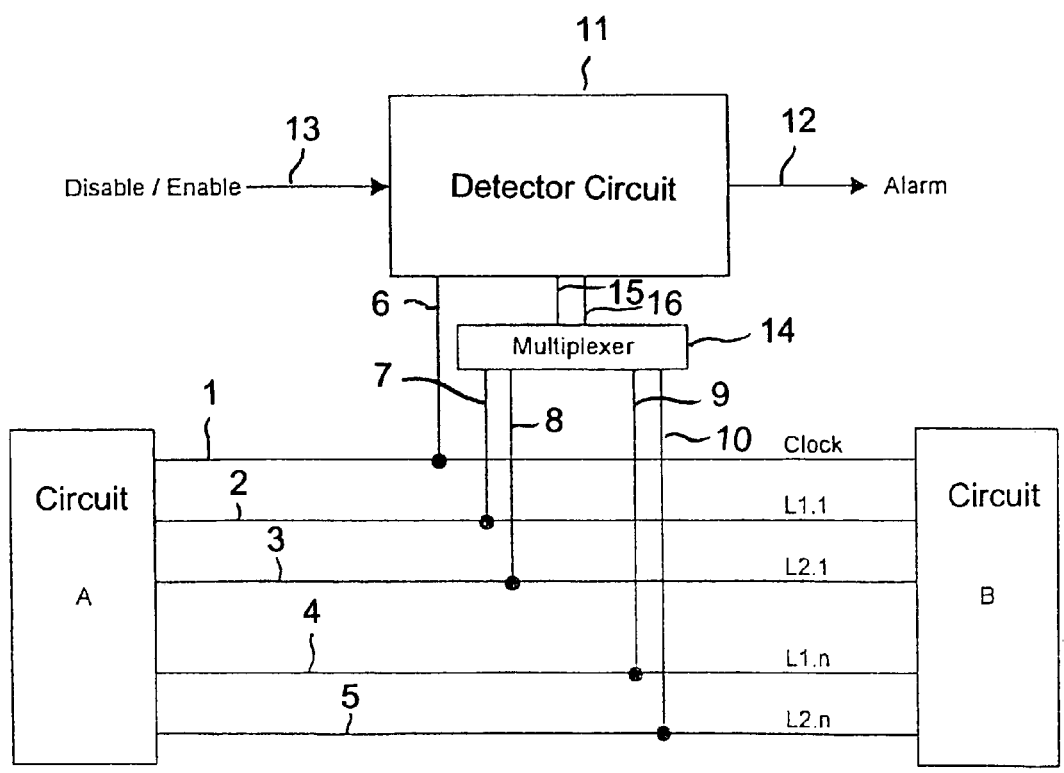
FIG. 2 is a block diagram of a second exemplary embodiment of the circuit configuration.

While all the line pairs can be checked simultaneously in FIG. 1, the line pairs in FIG. 2 are checked for a prohibited state in succession. Since the way in which a multiplexer works is sufficiently well known from the prior art, no detailed description of the way in which it works is given at this point.

The state tables in FIGS. 4 to 7 can be used to provide a better understanding of the way in which the inventive circuit configuration works. The first column identifies the number of a possible state. Columns 2 to 4 denote possible states of the signal line Clock and of the two lines in a line pair, which are identified by L1.k, L2.k in the present case. The wildcard k stands for line pairs 1 to n in this case. The last column indicates the logic value monitored by the detector circuit 11.

During the first four states (state numbers 1 to 4), the signal line Clock is in the "precharge phase". During this phase, the charge states on the two lines in a line pair L1.k, L2.k need to have identical values. In FIGS. 4 and 6, this is the case when L1.k and L2.k have the value Logic 1, while this is the case for a value of Logic 0 in FIGS. 5 and 7.

In the "evaluation phase" (state numbers 5 to 8), the lines L1.k, L2.k must not have an identical charge state. In the case of identical charge states, there is a fault or an attack. It is optionally possible to assign the state number 6 a logic value of 0 or 1. Accordingly, the logic value for the state number 7 is 1 or 0, that is to say it is the complement of the logic value of the state number 6.

Use of the state tables shown in FIGS. 4 and 5 for the inventive detection method is advantageous because the precharge phase is carried out for a logic value of 0 on the signal line Clock. Alternatively, it is naturally also conceivable to carry out the precharge phase for a value of Logic 1 and to carry out the evaluation phase for a value of Logic 0. This is shown in state tables 6 and 7.

Figure 3:
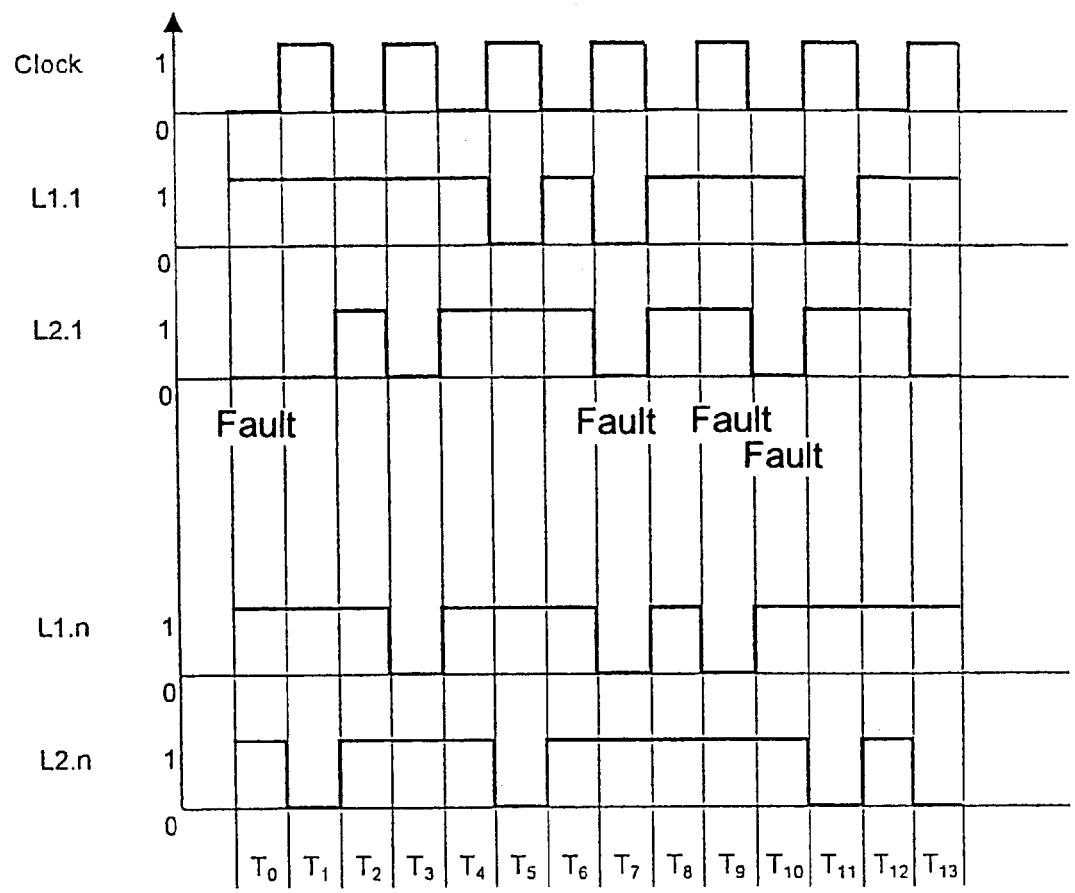
FIG. 3 is a graph showing an exemplary signal profile for a signal line and for two line pairs.

FIG. 3 shows an exemplary signal profile for the signal line "Clock" and for two line pairs L1.1, L2.1 and L1.n, L2.n. To check whether there is a prohibited state, for example a fault or an attack, it is fundamentally necessary to compare the signals on the signal line and the signals on a line pair with one another. The signal profile shown in FIG. 3 is evaluated on the basis of the state table shown in FIG. 4. Hence, the first line pair actually has a fault while the first signal value is on the signal line "Clock" (clock phase $T_0$), since the second line L2.1 does not adopt an identical signal value during the "precharge phase". During clock phases $T_7$ and $T_9$, there is a respective fault during the "evaluation phase", since in that case the signal states on the two lines in the line pair 1 have an identical charge state, which is prohibited on the basis of the state table shown in FIG. 4. Another fault occurs during clock phase $T_{10}$.

By contrast, the signal profile for the nth line pair is in order, as shown by a comparison with the state table shown in FIG. 4.

I claim:

1. A circuit configuration for detecting an unwanted attack on an integrated circuit having a first circuit block and a second circuit block, the circuit configuration comprising:
    a signal line for receiving a clock signal connected between the first and second circuit blocks;
    at least one line pair used to code a bit and connected between the first and second circuit blocks; and
    a detector circuit connected to said signal line and to said line pair, said detector circuit changing an operating sequence in the integrated circuit on a basis of signals on said signal line and on said line pair.

2. The circuit configuration according to claim 1, wherein each line in said line pair is connected directly to said detector circuit.

3. The circuit configuration according to claim 1, further comprising a multiplexer, and said line pair is one of a plurality of line pairs connected to said detector circuit through said multiplexer.

4. A method for detecting an unwanted attack on an integrated circuit having a line pair for transmitting a respective bit between a first and a second circuit block and a signal line (1) receiving a clock signal, which comprises the steps of:
    a) during a first signal value on the signal line, monitoring values on two lines of the line pair for a case where the two lines have identical signal levels;
    b) during a second signal value on the signal line, monitoring the two lines in the line pair for a case where the two lines have different signal levels;
    c) changing an operating sequence of the integrated circuit if a discrepancy from results expected in steps a) and/or b) is detected.

5. The method according to claim 4, which further comprises setting the first signal value on the signal line to be one of a Logic 0 and a Logic 1.

6. The method according to claim 5, which further comprises setting a signal level on the two lines in the line pair to be one of Logic 0 and Logic 1.

7. The method according to claim 4, which further comprises setting the second signal value on the signal line to be one of Logic 1 and Logic 0.

8. The method according to claim 7, which further comprises:
    setting a signal level on a first line in the line pair to one of Logic 0 or 1; and
    setting a signal level on a second line in the line pair to a complementary value of the signal level on the first line.

* * * * *